(12) United States Patent
Needham (10) Patent No.: US 6,617,868 B1
(45) Date of Patent: Sep. 9, 2003

(54) METHOD AND APPARATUS FOR CONTROLLING THE POWER AND HEAT OUTPUT IN A DEVICE TESTING SYSTEM

(75) Inventor: Wayne M. Needham, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/571,002

(22) Filed: May 15, 2000

Related U.S. Application Data (63) Continuation-in-part of application No. 08/993,330, filed on Dec. 18, 1997, now abandoned.

(51) Int. Cl.[7] .......................... G01R 31/02; H01H 31/02
(52) U.S. Cl. ..................... 324/760; 324/158.1; 324/537
(58) Field of Search .............................. 324/760, 158.1, 324/537, 761, 755, 756; 165/80.2, 80.4; 361/679

(56) References Cited

U.S. PATENT DOCUMENTS

| | | | | |
|---|---|---|---|---|
| 4,493,981 A | * | 1/1985 | Payne ................... 219/448.12 |
| 4,503,335 A | * | 3/1985 | Takahashi ................... 250/548 |
| 4,855,685 A | * | 8/1989 | Hochschild ................. 330/282 |
| 5,084,671 A | * | 1/1992 | Miyata et al. .............. 324/760 |
| 5,315,240 A | * | 5/1994 | Jones ......................... 324/760 |
| 5,568,054 A | * | 10/1996 | Iino et al. .................. 324/760 |
| 5,646,572 A | * | 7/1997 | Masleid ...................... 327/542 |
| 5,977,785 A | * | 11/1999 | Burward-Hoy ............. 324/760 |
| 6,032,724 A | * | 3/2000 | Hatta ........................ 165/80.2 |

* cited by examiner

Primary Examiner—Kamand Cuneo
Assistant Examiner—Paresh Patel
(74) Attorney, Agent, or Firm—Blakely, Sokoloff, Taylor & Zafman LLP

(57) ABSTRACT

A method and apparatus for testing integrated circuits is described. The method and apparatus provide a nearly constant power supply current load on the test power supply, and a nearly constant thermal load on the cooling system. This promotes more reliable and repeatable testing of production integrated circuits. A dummy load, in thermal contact with a device under test and the cooling system, consumes a value of current complementary to the current consumed by the device under test, which is under the control of a series of enhanced test vectors.

13 Claims, 8 Drawing Sheets

METHOD AND APPARATUS FOR CONTROLLING THE POWER AND HEAT OUTPUT IN A DEVICE TESTING SYSTEM

CROSS-REFERENCE TO RELATED APPLICATIONS

This application is a Continuation In Part, and claims the benefit of the filing date, of the U. S. Patent Application entitled "Method and Apparatus for Controlling the Power and Heat Output of a Device Testing System", Ser. No. 08/993,330, filed Dec. 18, 1997 now abandoned.

FIELD OF THE INVENTION

The present invention relates to a device testing system, and, more specifically, to a method and apparatus for controlling the power and stabilizing the heat output in a device testing system.

BACKGROUND

Present day integrated circuits, such as microprocessors, may consume small currents and dissipate small quantities of heat when in power-conserving operating modes, but may consume large currents and dissipate large quantities of heat when performing complex operations. Therefore, when production testing these integrated circuits, the power supplies used in the testing systems for the powering of the device under test (DUT), and the cooling system, must respond to extremely wide ranges of power, current, and heat.

As an example, when the DUT is in a power-conserving mode at start of a test (at cycle zero when measured in units of clock period), the current may be in the 1 to 2 milliamp (mA) range. Continuing the example, only three cycles later (e.g. 30 nanoseconds (nS) at clock frequencies of 100 MegaHertz (MHz)), the current required by the DUT may be as high as 60 Amps. Additionally, the heat dissipated in the example may be only around 3 to 6 milliwatts during cycle zero, but may increase to 50 to 60 watts during cycle three.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for testing integrated circuits is described. The method and apparatus provide a nearly constant power supply current load on the test power supply, and a nearly constant thermal load on the cooling system. This promotes more reliable and repeatable testing of production device under test integrated circuits. A dummy load, in thermal contact with the device under test and the cooling system, consumes a complementary value of current to the current consumed by the device under test under the control of a series of enhanced test vectors.

Figure 1A:
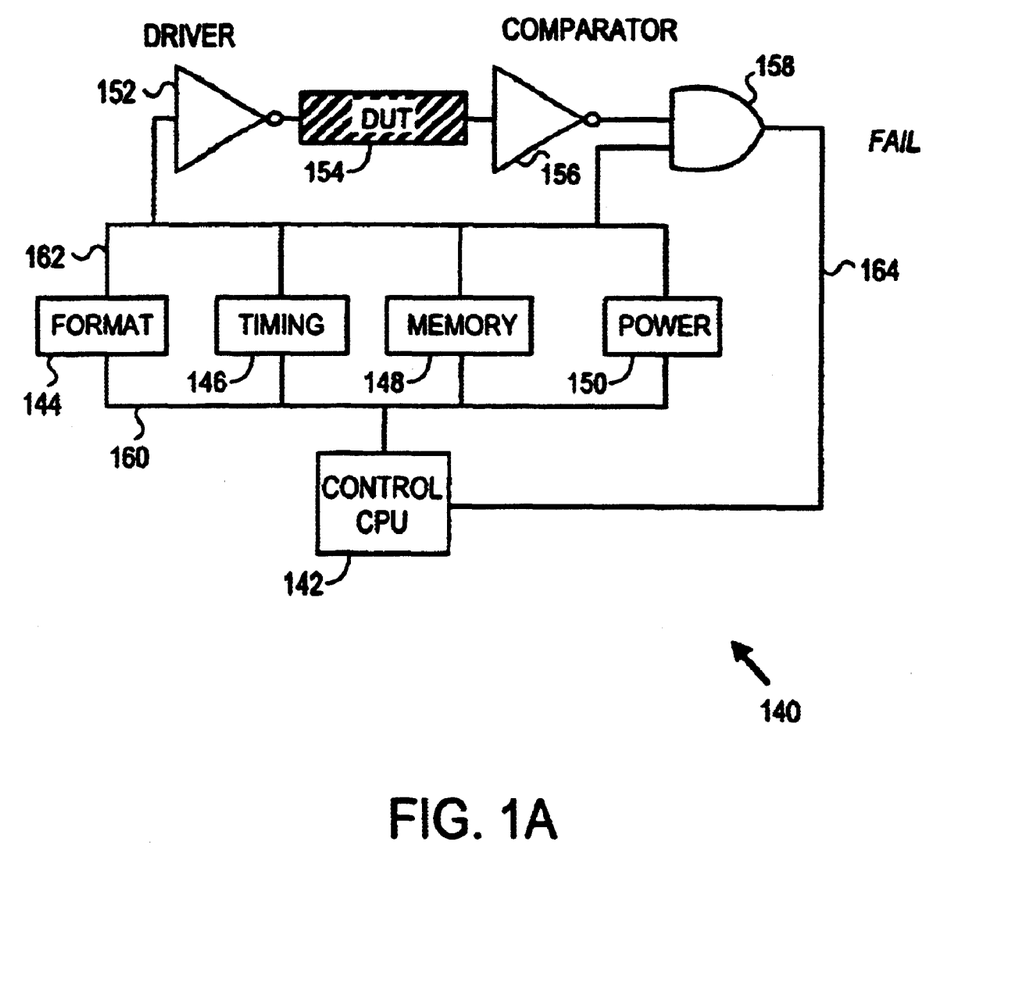
FIG. 1A is a logic diagram of a representative integrated circuit testing system.

Referring now to FIG. 1A, a logic diagram of a representative integrated circuit (IC) testing system 140 is shown. In order to test the device under test (DUT) 154, control central processing unit (CPU) 142 may issue commands via control bus 160 to testing system modules format 144, timing 146, memory 148, and power supply 150. These testing system modules may then send signals to DUT 154 via drivers 152, and receive signals from DUT 154 via comparators 156. Actual signals output from DUT 154 and detected via comparators 156 may thus be compared to expected signal values from test bus 162 using a series of gates 158. When the actual signal outputs do not match the expected signal values, gates 158 may send a fail signal 164 to control CPU 142, signifying the existence of a problem in DUT 154.

Figure 1B:
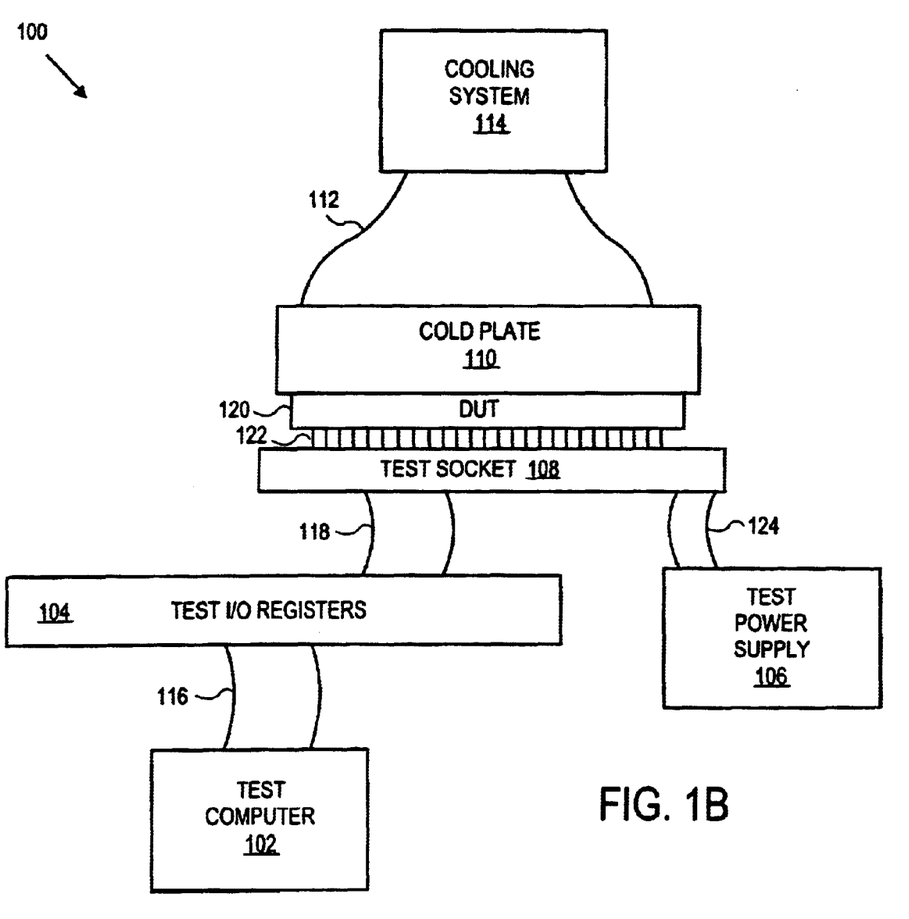
FIG. 1B is a block diagram detailing the interface between the device under test and the integrated circuit testing system.

Referring now to FIG. 1B, a block diagram detailing the interface between the DUT 120 and an IC testing system 100 is shown. IC testing system 100 may include a test computer 102, test input/output (I/O) registers 104, a test power supply 106, a test socket 108, a cold plate 110, a manifold 112, and a cooling system 114. The target DUT 120 is not part of the IC testing system 100, but may be placed in the test socket 108 during testing.

Test socket 108 may support any kind of integrated circuit DUT 120, such as a microprocessor, a memory, an application specific IC (ASIC), or a gate array. The packaging of the DUT 120 may be a pin grid array (PGA), a leadless chip carrier (LCC), or any other IC packaging type. In the FIG. 1B example, a PGA DUT 120 is shown. Test socket 108 may include many test socket contacts (not shown), each test socket contact receiving a pin 122 of the DUT 120. For example, if DUT 120 is an Intel® Pentium® processor, DUT 120 may have 296 pins 122, and therefore test socket 108 may also have 296 test socket contacts.

Some of the test socket contacts may be connected via an interconnect 124 to the test power supply 106. The remaining test socket contacts may be connected via an interconnect 118 to a set of test I/O registers 104. The outputs of the test I/O registers 104 are a series of digital transceivers, one per test socket contact, which may receive or send electronic signals via the test socket contacts to the pins 122 of the DUT 120. In this manner, the test I/O registers may emulate the intended system environment for the DUT 120.

The test I/O registers 104 may be controlled by the test computer 102. The test computer 102 may send a long digital word, called a test vector, to the test I/O registers 104 via an interconnect 116. Each bit position in a test vector may contain a 1 or a 0, which may correspond to a logic High or a logic Low at the output of the test I/O registers 104. In this manner, the test computer 102 may send a series of test vectors, called a test program, to the test I/O registers 104. From the test I/O registers 104 onward, the test vectors' logical state are sent as electronic signals to the DUT 120. In this manner the test computer 102 may exercise the DUT 120 and determine whether the DUT 120 is functioning correctly.

The test power supply 106 supplies power to the DUT 120 via an interconnect 124, a subset of the test socket contacts, and the corresponding subset of pins 122 of DUT 120. In one embodiment, the test power supply 106 may produce a set of standard, nominal voltages to supply power for the DUT 120. In other embodiments, the test power supply 106 may produce supply voltages which are controllable and may vary from the lowest specified supply voltages to the largest specified supply voltages. As an example, one supply voltage may be specified as a nominal 3.2 Vdc, but the IC may be specified to operate at supply voltages from 3.1 Vdc to 3.3 Vdc. For this example, the test power supply 106 may be externally controlled to vary from 3.1 Vdc to 3.3 Vdc in order to support testing the DUT 120 over the complete specified supply voltage range.

In addition to supplying the exercising electronic signals and electrical power to the DUT 120, the IC testing system 100 may control the temperature of the DUT 120. In one embodiment, a thermally-conductive cold plate 110 is mounted in thermal contact with the DUT 120. Heat generated in DUT 120 may be exhausted via the cold plate 110 and manifold 112 to the cooling system 114. In one embodiment, the manifold 122 may be a metallic conductor. In other embodiments, manifold 122 may use circulating liquid or gaseous coolant.

Cooling system 114 may perform differing functions depending upon the manner of testing to be performed. In one embodiment, cooling system 114 merely needs to keep DUT 120 within a nominal temperature range. In other embodiments, cooling system 114 may need to closely control the temperature of DUT 120 near the specified minimum and maximum operating temperatures. For example, for one DUT 120 the minimum operating temperature may be 0° Celsius, and the maximum operating temperature may be 70° Celsius. In this example, cooling system 114 may be controllable to keep DUT 120 near 0° Celsius during part of the testing and later keep DUT 120 near 70° Celsius during another part of the testing. Thermocouples or other thermal sensors (not shown) may be required for cooling system 114 to maintain the temperature of DUT 120.

Figure 2:
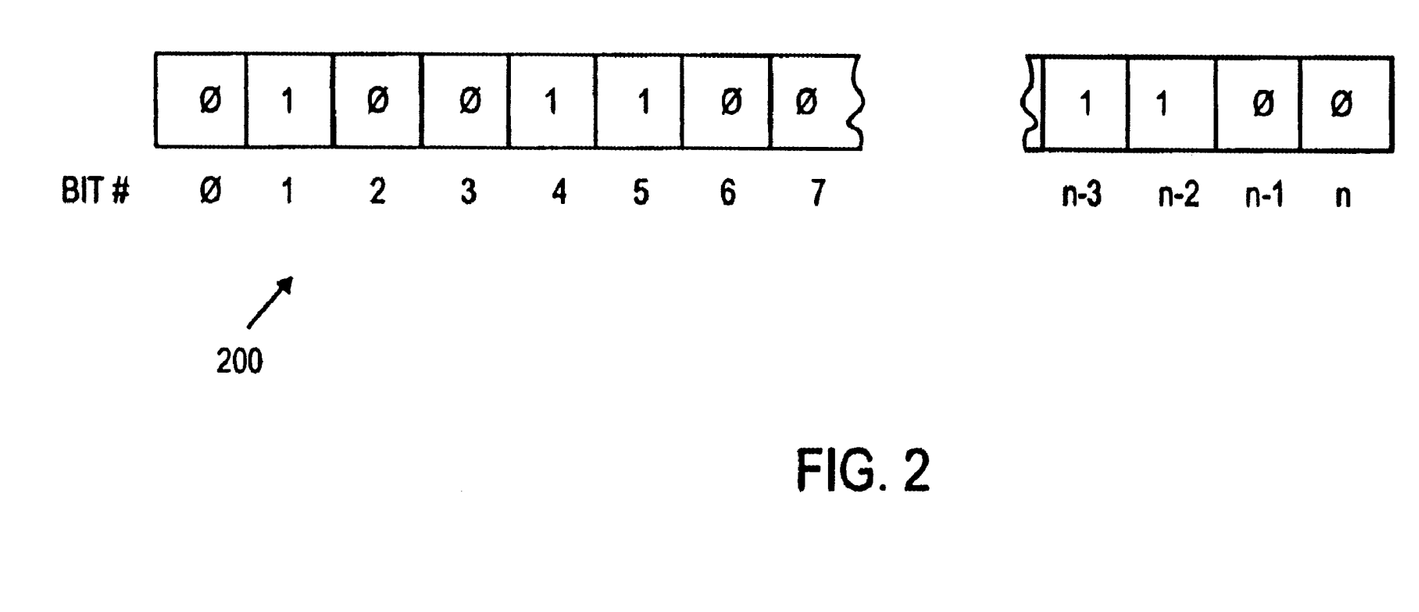
FIG. 2 is a bit placement diagram of a test vector.

Referring now to FIG. 2, a bit placement diagram of a test vector 200 is shown. Each bit location within test vector 200 may be used to write to or read from a corresponding register location within test I/O registers 104. In the FIG. 2 example, bit number 3 contains a "0", which may be interpreted by test I/O registers 104 as a command to send a logic Low electronic signal over a particular test socket contact to a corresponding pin 122 of DUT 120.

Recall that the DUT 120 of FIG. 1B may have a very large number of pins 122. A large subset of the pins 122 must be driven by electronic signals in order to exercise the DUT 120. For example, if the DUT 120 is a microprocessor, the address bus signals, the data bus signals, and the control bus signals must all be driven in a controlled manner to direct the DUT 120 to perform operations as part of a test plan. Therefore, the test vector 200 used to program the test I/O registers 104 must contain an equally large number of bits.

Test computer 102 may be a 32 bit processor, a 64 bit processor, or any other common bit width processor. Several I/O words from test computer 102 may need to be transmitted over interconnect 116 to form each test vector 200. Additionally, test I/O registers 104 may need to change rapidly from one test vector 200 to another, so test I/O registers may include a buffer for storing multiple test vectors. In this manner test I/O registers 104 may exercise a DUT 120 much more quickly than test computer 102 could.

Figure 3:
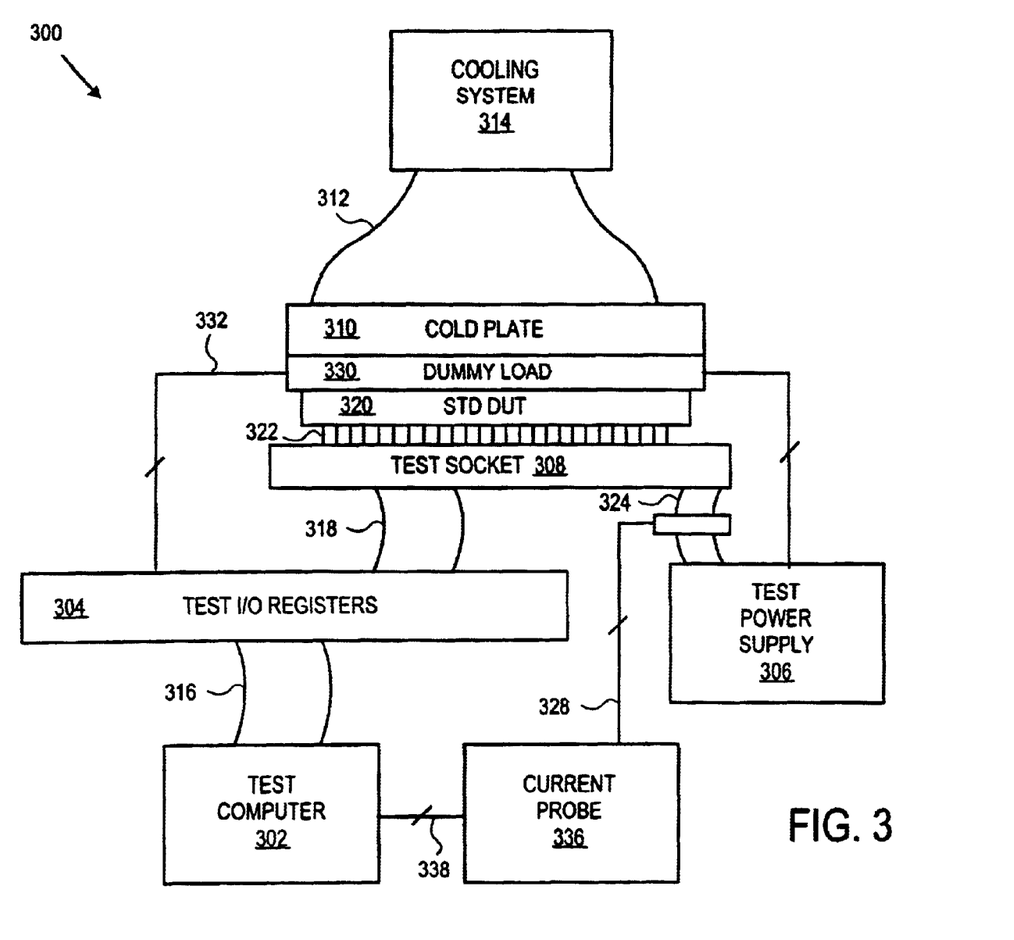
FIG. 3 is a block diagram of an enhanced integrated circuit testing system operating on a standard device under test, according to one embodiment of the present invention.

Referring now to FIG. 3, a block diagram of an enhanced IC testing system 300 operating on a standard DUT 320 is shown, according to one embodiment of the present invention. Standard DUT 320 is a representative sample DUT that is known to be good. The purpose of operating IC testing system 300 with a standard DUT 320 is to determine the power consumption of a DUT during differing times in a test program controlled by a series of test vectors. In one embodiment, with a single power supply voltage, a power supply current Icc value may then be associated with each test vector. In alternate embodiments, with multiple power supply voltages, power supply current Icc values for each supply voltage may be associated with each test vector.

Enhanced IC testing system 300 may include a test computer 302, extended test I/O registers 304, a current probe 336, a test power supply 306, a test socket 308, a cold plate 310 with attached dummy load 330, a manifold 312, and a cooling system 314. Current probe 336 may be connected via current probe connection 328 to the interconnect 324 from test power supply 306 to the test socket 324. Test computer 302 may receive supply current Icc data from current probe 336 over interconnect 338. In this manner, when test computer 302 issues test vectors to extended test I/O registers 304, test computer 302 may determine the corresponding supply current Icc or currents. Test computer 302 may then make a data log of supply currents associated with the issuance of each test vector in a test program.

In alternate embodiments, the simulation of supply currents Icc associated with the issuance of each test vector may be created by the integrated circuit designers. An estimate of current required by the DUT when exercised by the electrical signal outputs of the extended test I/O registers 304 acting in response to each test vector may be estimated with sufficient accuracy. In this manner a simulation of supply currents Icc corresponding with each test vector may be created without performing tests upon an actual device.

Figure 4A:
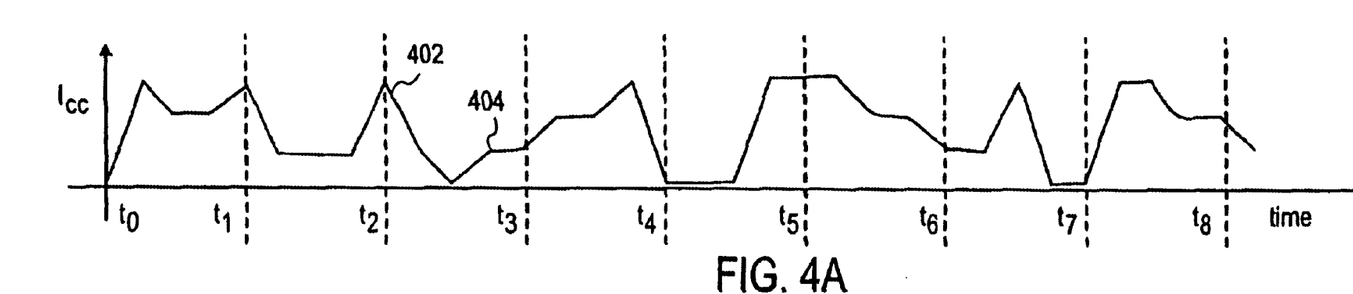
FIG. 4A is a timing diagram of the supply current of an integrated circuit, which is related to the heat production of the integrated circuit, according to one embodiment.

Referring now to FIG. 4A, a timing diagram of the supply current Icc of an integrated circuit, which is related to the heat production of the integrated circuit, is shown, according to one embodiment. FIG. 4A is a graphical representation of an exemplary data log of supply currents Icc discussed above in connection with FIG. 3. For example, FIG. 4A may represent the Icc consumed by a microprocessor during the execution of a test program consisting of a series of test vectors. In this example, at time t2 the microprocessor is stimulated by a test vector representing a floating point operation. A relatively large current Icc 402 is consumed at this time. Later on, at time t3, the microprocessor is stimulated by a test vector representing a logical operation. A relatively small current Icc 404 is consumed at this time. Examination of the entire data log of Icc allows the determination of the maximum Icc value during the test program, Imax.

It is noteworthy that the instantaneous value of Icc is strongly related to the heat production rate within the integrated circuit.

Figure 4B:
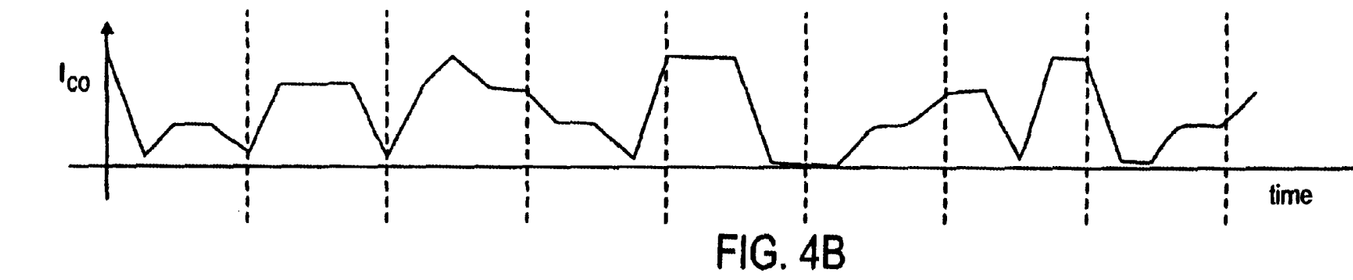
FIG. 4B is a timing diagram of the complementary supply current, which is related to the compliment of the heat production of the integrated circuit, according to one embodiment.

Referring now to FIG. 4B, a timing diagram of the complementary supply current Ico, which is related to the compliment of the heat production of the integrated circuit, is shown, according to one embodiment. In this context, a complementary current is one which, when added to the original current, yields an approximately constant value. Each value of Ico shown in FIG. 4B is determined from the exemplary Icc graph of FIG. 4A by the equation Ico=Imax−Icc. In alternate embodiments, another constant value C differing from Imax may be used in the determination of the values of Ico=C−Icc.

It is again noteworthy that the instantaneous value of Ico is strongly related to a compliment to the heat production rate within the integrated circuit. Here the compliment to the heat production rate refers to a function which, when added to the heat production rate, yields an approximately constant value.

Figure 4C:
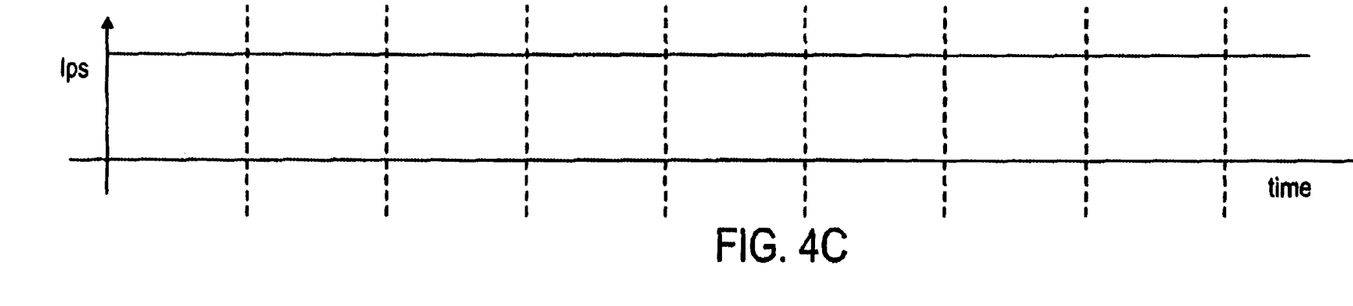
FIG. 4C is a timing diagram of the overall supply current of the device under test power supply, which is related to the overall heat production, according to one embodiment.

Referring now to FIG. 4C, a timing diagram of the overall supply current Ips of the test power supply 106 is shown, according to one embodiment. In the FIG. 3 embodiment, a dummy load 330 is configured to consume a complementary supply current Ico whenever the standard DUT 320 consumes supply current Icc. The sum of the varying Ico+Icc is then an essentially constant value for Ips.

It is again noteworthy that the instantaneous value of Ips is strongly related to sum of the heat production rate and the compliment to the heat production rate within the integrated circuit.

Figure 5:
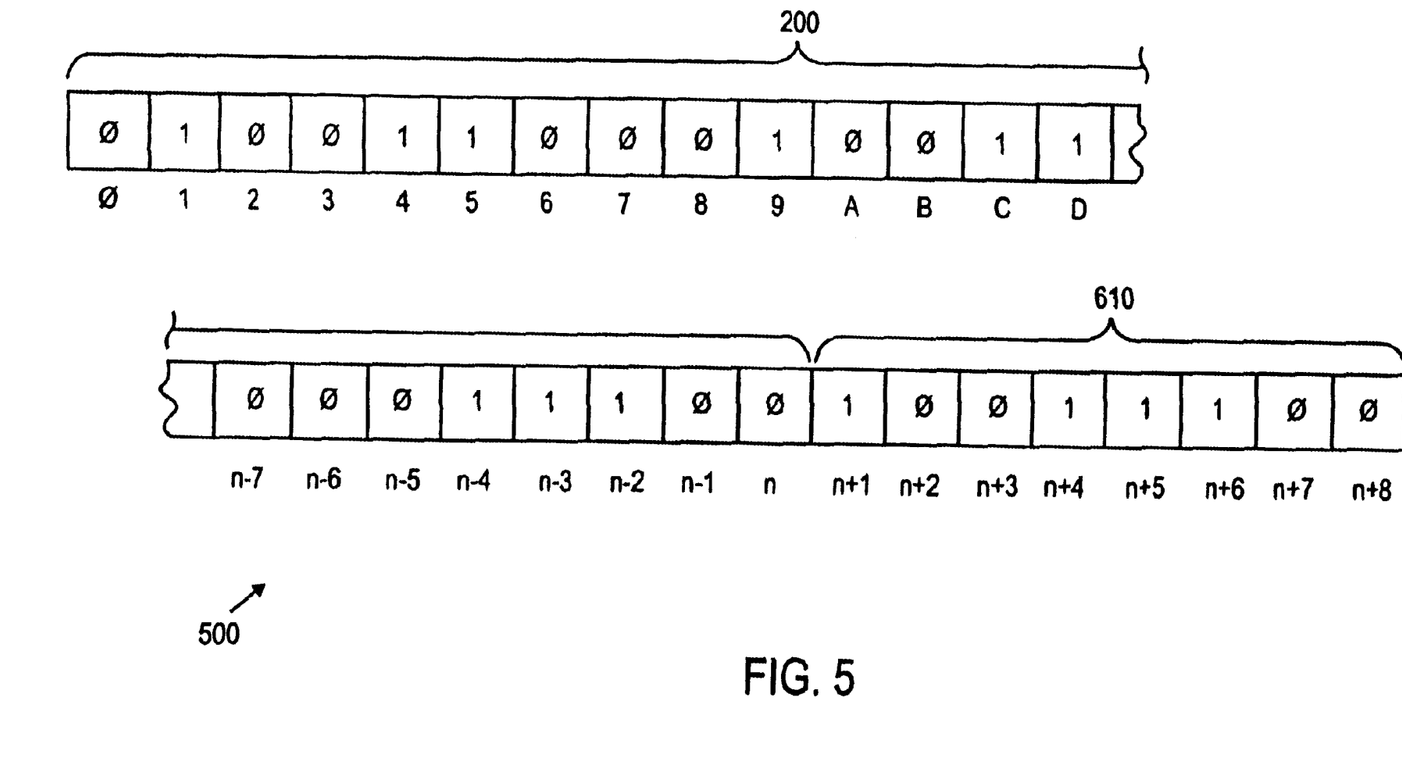
FIG. 5 is a bit placement diagram of an enhanced test vector, according to one embodiment of the present invention.

Referring now to FIG. 5, a bit placement diagram of an exemplary enhanced test vector 500 is shown, according to one embodiment of the present invention. Enhanced test vector 500 includes the test vector 200 of FIG. 2, which occupies bits 0 through n. An additional number of bits have been tagged onto test vector 200 to form enhanced test vector 500. In one exemplary embodiment, eight additional bits are used. In the FIG. 5 example, bit (n+1) is a most significant bit (MSB) and bit (n+8) is a least significant bit (LSB). Eight bits yield approximately a 1 in $2^8$ (1 in 256) granularity of accuracy. In other embodiments, fewer than eight or greater than eight bits may be used.

The additional eight bits may collectively be termed a load control vector 610. Load control vector 610, when loaded into the test I/O registers 304, may control the current consumption in dummy load 330. The binary value of load control vector 610 is chosen such that it corresponds via a functional relationship to the complementary supply current Ico associated with test vector 200. In this manner, each test vector 200 within a test program may have attached to it the load control vector 610 which provides the value of Ico.

Figure 6:
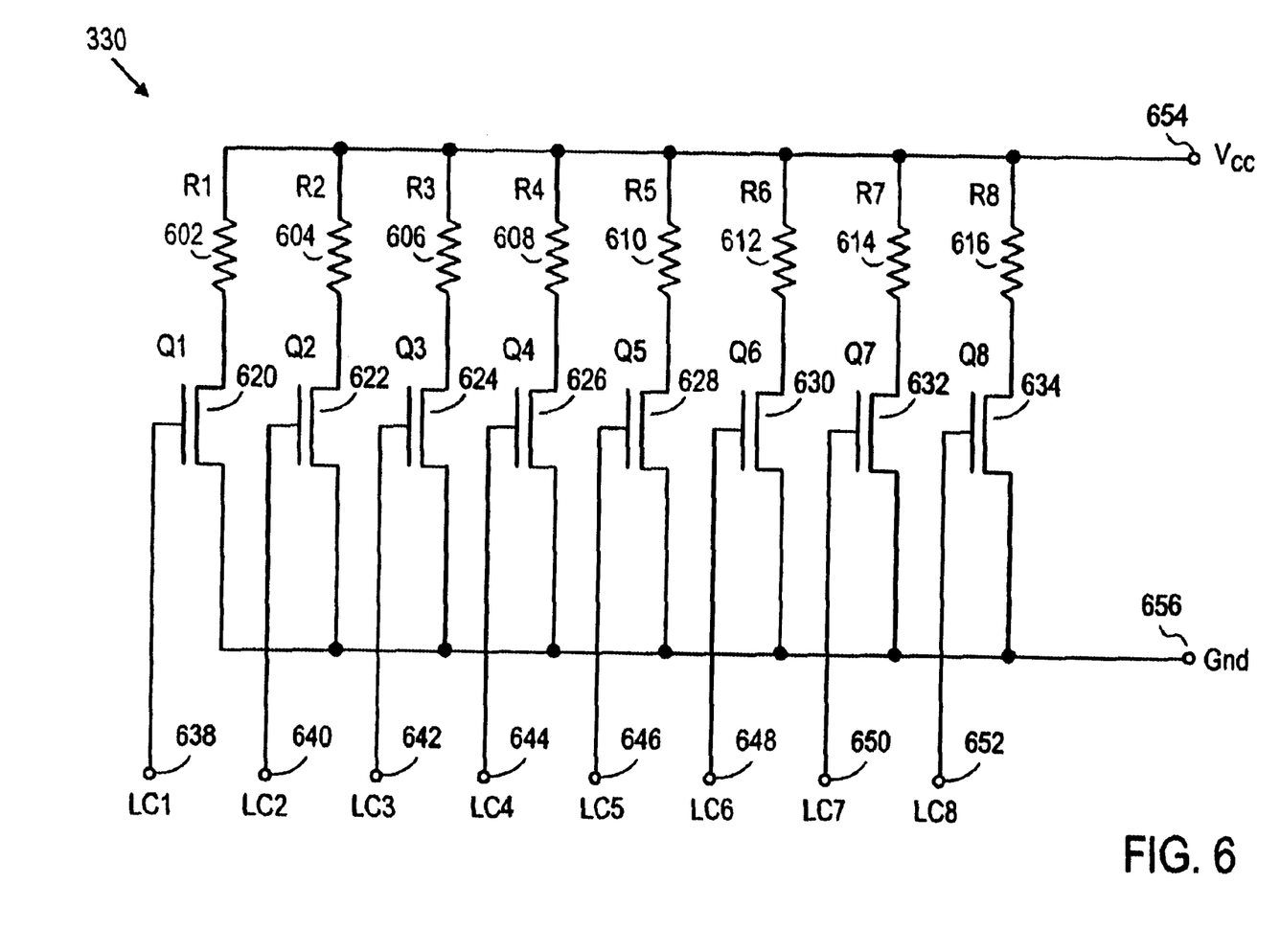
FIG. 6 is a schematic diagram of the dummy load of FIG. 3, according to one embodiment of the present invention.

Referring now to FIG. 6 is a schematic diagram of the dummy load 330 of FIG. 3, according to one embodiment of the present invention. Dummy load 330 may include resistors R1 602 through R8 616, and transistors Q1 620 through Q8 636. Terminals 654 and 656 connect with power and ground from test power supply 306 via interconnect 334. Terminals 638 through 652 connect the gates of transistors Q1 620 through Q8 634, respectively, to the outputs of registers LC1 through LC8, respectively, of the test I/O registers 304 via interconnect 332. In this manner the load control vector 610 may selectively control which transistors Q1 620 through Q8 634 are turned on. When, for example, bit (n+a) of load control vector 610 is a logical 1, the output of the corresponding register LCa of test I/O register is a logic high state. Thus when bit (n+a) is a logical 1, current flows in resistor Ra. When bit (n+a) is a logical 0, current no longer flows in resistor Ra.

In one embodiment, the values of resistors R1 602 through R8 616 may be chosen not only that the parallel sum of the resistors Rt=Vcc/Imax but also that the values of R1 602 through R8 616 increase in series by powers of 2. Setting the parallel sum Rt=Vcc/Imax implies that the maximum current through the resistors R1 602 through R8 616 when all the transistors Q1 620 through Q8 634 are turned on is Imax, the maximum current consumed by the standard DUT 320. Note that when all the transistors Q1 620 through Q8 634 are turned off the current through the resistors R1 602 through R8 616 is essentially zero. Therefore choosing Rt=Vcc/Imax enables dummy load 330 to consume currents in the range of from zero to Imax.

Additionally, choosing the values of R1 602 through R8 616 to increase in series by powers of 2 simplifies the determination of the bits within the load control vector 610. Let each Ra be $2^{(a-1)}$ Ro. Therefore R1=Ro, R2=2Ro, and in sequence until R8=256Ro. Using the formula for the addition of parallel-connected resistors, Rt=Ro[1+½+¼+ . . . 1/128]=Ro[128/255]. A good approximate value then is Rt=Ro/2. Using Rt=Vcc/Imax=Ro/2, we then may set Ro=2Vcc/Imax. Thus R1=Ro=2Vcc/Imax, R2=2Ro=4Vcc/Imax, and in sequence until R8=256Ro=512Vcc/Imax. Choosing resistor values for R1 602 through R8 616 in this manner is not necessary for the practice of the present invention but has the advantage of making the numeric value of the load control vector 610 be proportionate to the desired current consumed in dummy load 330.

Figure 7:
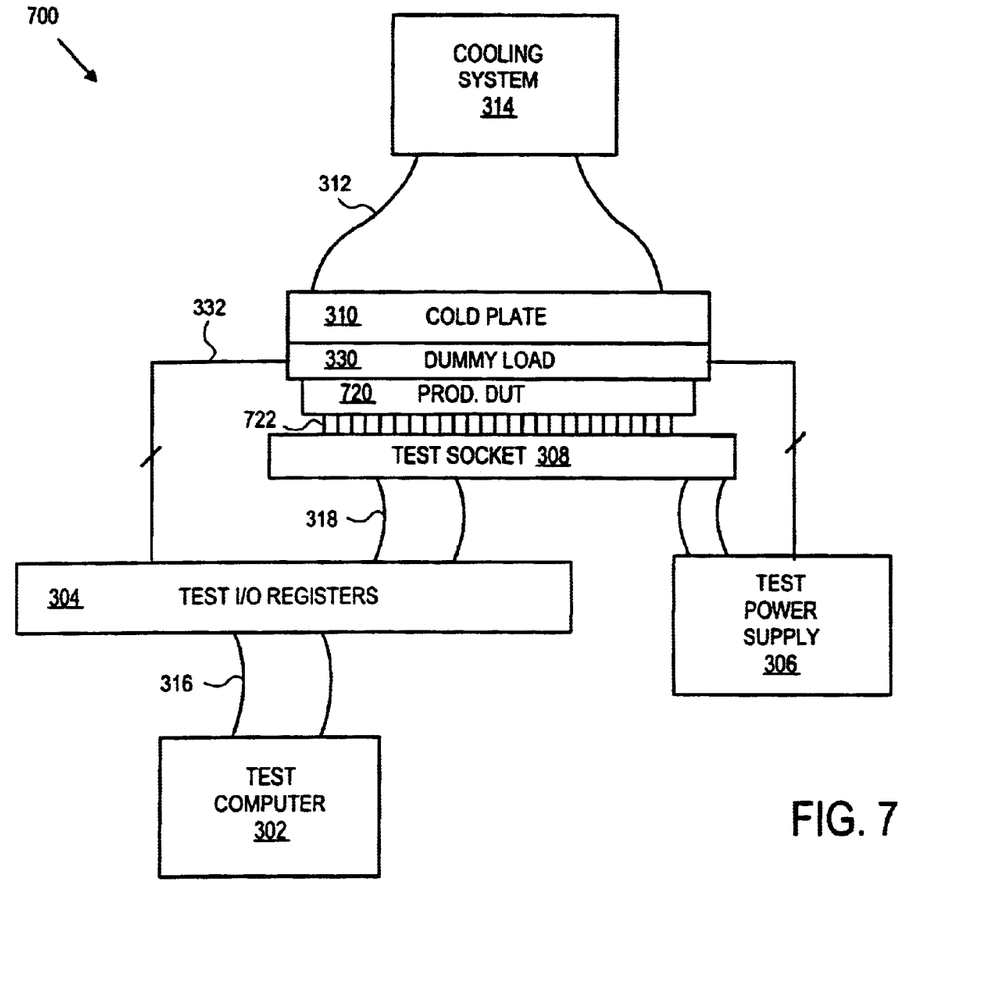
FIG. 7 is a block diagram of an enhanced integrated circuit testing system operating on a production device under test, according to one embodiment of the present invention.

Referring now to FIG. 7, a block diagram of an enhanced integrated circuit testing system operating on a production device under test is shown, according to one embodiment of the present invention. In the discussions above in connection with FIGS. 3, 4, 5, and 6 the values of the load control vectors 610 and the resistors R1 602 through R8 616 were determined, a process which may be referred to as calibrating the IC test system 300. In the FIG. 7 embodiment these predetermined values are utilized in a production IC test system 700. Production IC test system 700 may include the test computer 302, extended test I/O register 304, test power supply 306, test socket 308, cold plate 310 with attached dummy load 330, manifold 312, and cooling system 314 of the IC testing system 300, but no longer requires current probe 336. Production IC test system 700 may operate sequentially on numerous production DUT 720, as may be desired in production runs of ICs.

When the enhanced test vectors 500 are issued by test computer 302, electronic signals are issued from test I/O register 304. Electronic signals corresponding to the test vectors 200 travel to production DUT 720 via interconnect 318 and test socket 308. Electronic signals corresponding to the load control vectors 610 travel to dummy load 330 via interconnect 318. In this manner a complementary current Ico is consumed in dummy load 330 whenever the supply current Icc is consumed in production DUT 720. This presents to test power supply 306 an approximately constant overall current load throughout production DUT 720 testing.

Additionally, this presents an approximately equal thermal load to cooling system 314 via cold plate 310 and manifold 312. The heat dissipated by dummy load 330 is Vcc times Ico, because dummy load 330 presents a resistive load. The heat dissipated by production DUT 720 will not be exactly Vcc times Icc because production DUT 720 is not a resistive load and may distribute current to other circuits. However, the total heat dissipated by the dummy load 330 and the production DUT 720 will be close in value to Vcc(Ico+Icc)=Vcc(Imax), and therefore close in value to a constant.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A system, comprising:
    a cooling system;
    a cold plate operatively coupled with the cooling system, the cold plate to contact a first device under test positioned in a test socket;
    a dummy load attached to the cold plate and controlled by electronic signals produced by a register, the dummy load configured to consume a complimentary first current to a second current generated in the first device under test, wherein the register produces the electronic signals in response to a load control vector associated with a test vector.

2. The system of claim 1 wherein the electronic signals control a plurality of switches of the dummy load.

3. The system of claim 2, wherein said switches control current through a plurality of resistors.

4. The system of claim 1, wherein said dummy load is mounted between said cold plate and said first device under test.

5. A system as in claim 1, wherein the test vector is a digital word comprised of a first plurality of bits and sent by a test computer to the register via an interconnect coupling the computer to the register.

6. A system as in claim 5, wherein the first plurality of bits corresponds to a second plurality of register locations.

7. A system as in claim 6, wherein a bit of the plurality of bits contains a zero which may be interpreted by a conventional register of the corresponding plurality of register locations as a command to send a logic low electronic signal via the test socket to a corresponding pin of the device under test.

8. A system as in claim 5, wherein the load control vector further comprises:
    a second plurality of bits tagged onto the test vector.

9. A system as in claim 8, wherein current consumption in the dummy load is controlled by the load control vector when the bits comprising the load control vector are loaded into a corresponding plurality of register locations.

10. A system as in claim 1, wherein the test vector controls a current consumed by the device under test.

11. A system as in claim 1, wherein the load control vector controls a current consumed by the dummy load.

12. A method, comprising:
    connecting a dummy load controlled by electronic signals produced a register with a device under test positioned in a test socket;
    connecting a cold plate to the dummy load, the cold plate operatively coupled with a cooling system;
    exhausting heat from said cold plate utilizing the cooling system;
    providing a complimentary first current to the dummy load when a second current is applied to the device under test; and
    applying a load control vector associated with a test vector to the register to produce the electronic signals from the register.

13. A method as in claim 12, wherein applying a load control vector associated with a test vector to the register further comprises:
    forming the test vector in a computer as a digital word comprised of a first plurality of bits;
    forming the load control vector in the computer as a second plurality of bits; and
    tagging the second plurality of bits onto the first plurality of bits.

* * * * *